United States Patent [19]
Lien

[11] Patent Number: 5,861,339
[45] Date of Patent: Jan. 19, 1999

[54] RECESSED ISOLATION WITH DOUBLE OXIDATION

[75] Inventor: Chuen-Der Lien, Los Altos Hills, Calif.

[73] Assignee: Integrated Device Technology, Inc., Santa Clara, Calif.

[21] Appl. No.: 549,367

[22] Filed: Oct. 27, 1995

[51] Int. Cl.[6] .................................................. H01L 21/76
[52] U.S. Cl. .......................................................... 438/452
[58] Field of Search .............. 437/69, 70; 148/DIG. 85, 148/DIG. 86, DIG. 117; 438/452, 229, 230

[56] References Cited

U.S. PATENT DOCUMENTS

| | | |
|---|---|---|
| 4,407,696 | 10/1983 | Han et al. . |
| 4,443,932 | 4/1984 | Mastroianni et al. . |
| 4,462,846 | 7/1984 | Varshney . |
| 4,541,167 | 9/1985 | Havemann et al. . |
| 4,551,910 | 11/1985 | Patterson . |
| 4,564,394 | 1/1986 | Bussmann . |
| 4,570,325 | 2/1986 | Higuchi . |
| 4,622,096 | 11/1986 | Dil et al. . |
| 4,626,317 | 12/1986 | Bonn . |
| 4,627,883 | 12/1986 | Holmstrom et al. . |
| 4,630,356 | 12/1986 | Christie et al. . |
| 4,743,566 | 5/1988 | Bastiaens et al. . |
| 4,748,134 | 5/1988 | Holland et al. . |
| 4,775,644 | 10/1988 | Szeto . |
| 4,814,290 | 3/1989 | Barber et al. . |
| 4,818,235 | 4/1989 | Chao . |
| 4,829,019 | 5/1989 | Mitchell et al. . |
| 4,840,920 | 6/1989 | Suda . |
| 4,868,136 | 9/1989 | Ravaglia . |
| 4,897,364 | 1/1990 | Nguyen et al. . |
| 4,897,365 | 1/1990 | Baldi et al. . |
| 4,906,595 | 3/1990 | van der Plas et al. . |
| 4,912,062 | 3/1990 | Verma . |
| 4,923,563 | 5/1990 | Lee . |
| 4,927,780 | 5/1990 | Roth et al. . |
| 4,942,449 | 7/1990 | Wei et al. . |
| 4,952,525 | 8/1990 | van der Plas . |
| 4,965,221 | 10/1990 | Dennison et al. . |
| 4,966,858 | 10/1990 | Masquelier et al. . |
| 5,071,777 | 12/1991 | Gahle . |
| 5,427,971 | 6/1995 | Lee et al. . |
| 5,468,676 | 11/1995 | Madan . |
| 5,498,556 | 3/1996 | Hong et al. . |
| 5,656,537 | 8/1997 | Toshiaki et al. . |
| 5,726,093 | 3/1998 | Yu et al. . |

FOREIGN PATENT DOCUMENTS

| | | |
|---|---|---|
| 233915 | 2/1990 | Japan . |
| 3236235 | 10/1991 | Japan . |
| 5152233 | 6/1993 | Japan . |
| 1437112 | 5/1976 | United Kingdom . |

OTHER PUBLICATIONS

Martin, R., "Spacer for Improved Oxidation Profile", Xerox Disclosure Bulletin, vol. 12, No. 5, 9, Oct. 1987, pp. 251–253.

*Primary Examiner*—George R. Fourson
*Attorney, Agent, or Firm*— Skjerven,Morrill,MacPherson, Franklin & Friel

[57] ABSTRACT

A method provides a recessed isolation is provided in a semiconductor substrate by (a) growing a first field oxide, (b) selectively removing portions of the first field oxide to leave recessed areas in the semiconductor substrate, and (c) growing a second field oxide from the recessed areas in a controlled manner, so that the surface of the semiconductor substrate is substantially planar. In one embodiment, nitride spacers are provided to limit lateral encroachment by the second field oxide from encroaching the active areas of the semiconductor substrate.

8 Claims, 2 Drawing Sheets

RECESSED ISOLATION WITH DOUBLE OXIDATION

BACKGROUND OF THE INVENTION

1. Field of the Invention

The present invention relates to integrated circuit manufacturing; in particular, the present invention relates to methods for isolating devices on an integrated circuit.

2. Discussion of the Related Art

Local oxidation of silicon (LOCOS) has been widely used for isolating active components fabricated on the surface of a semiconductor substrate. Typically, LOCOS is used to create a region of electrically insulating silicon oxide, usually referred to as "field oxide", between two regions ("active regions" or "island regions") in which circuit elements or devices are fabricated. Without proper control, LOCOS creates an oxide region which grows not only in the vertical direction but also laterally. Thus, a field oxide formed under LOCOS suffers from two disadvantages. First, the field oxide "encroaches" into the active regions, forming a tapering structure (commonly referred to as a "bird's beak") extending into the active regions. Consequently, active regions have to be given additional area to compensate for this encroachment, such that the device density achievable in the integrated circuit is adversely affected. Second, the field oxide grows vertically, so that the semiconductor surface lacks planarity. Maintaining planarity is essential to successful fabrication of modern complex integrated circuits.

Various approaches are known in the prior art to enhance planarity. In one technique, known as recessed isolation, a groove or trench of predetermined depth is cut by an anisotropic etch into the semiconductor substrate. Under that approach, the field oxide is grown by LOCOS from the bottom of the groove or trench. Since it is grown from a recessed position, the resulting field oxide does not disrupt surface planarity as its non-recessed counterpart. However, because this approach requires an etching of silicon to create the trench or groove, undesirable damage to the semiconductor surface may result.

Various approaches have also been attempted in the prior art to limit the field oxide's encroachment into an active region. In one such technique, an oxidation resistant material, such as nitride or certain polymers, is provided on the side walls of the groove or trench, so as to check the lateral growth of the field oxide. Such techniques tend to require a high degree of process control to deliver the intended result.

SUMMARY OF THE INVENTION

In accordance with the present invention, a method for forming recessed isolation in a semiconductor substrate is provided. The method of the present invention includes the steps of: (a) forming a nitride layer on the surface of the semiconductor substrate; selectively removing the nitride layer to expose and define the field regions of the semiconductor substrate; (c) oxidizing the field regions to form sacrificial field oxide regions; (d) forming nitride spacers abutting the side walls of the nitride layer, so as to form extended nitride regions over the sacrificial field oxide regions; (e) using the extended nitride regions as masks, removing substantially all of the sacrificial field oxide regions, so as to form recessed regions in the semiconductor substrate; and (e) oxidizing the recessed regions to form the final field oxide regions. The oxidizing steps can be performed by local oxidation of silicon (LOCOS).

In one embodiment, a further step of providing a deposited oxide layer on top of the nitride layer is provided. This deposited oxide protects the nitride layer during both the formation of the nitride spacers and the removal of the sacrificial field oxide regions. As a result, a thinner nitride layer can be provided, thereby minimizing stress on the surface of the semiconductor substrate.

Thus, the present invention provides a very controllable process because of the industry's extensive understanding of the properties and the formation processes of silicon dioxide. Further, because silicon is not etched in a process of the present invention, damage to the semiconductor surface is avoided, without sacrificing the advantage of the planarity achievable in a recessed isolation technique.

The present invention is better understood upon consideration of the detailed description below, and the accompanying drawings.

DETAILED DESCRIPTION OF THE PREFERRED EMBODIMENT

Figure 1A:
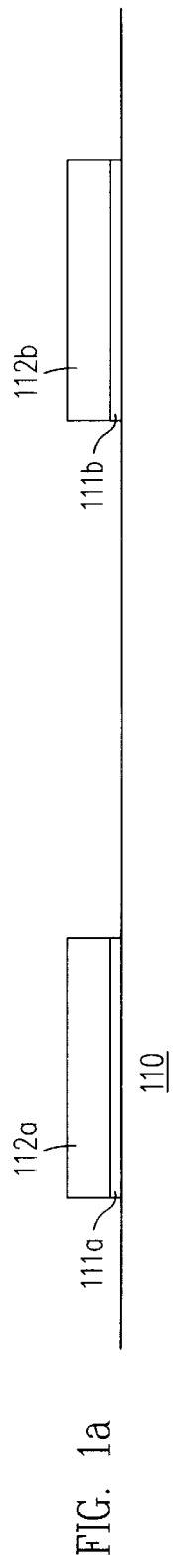
FIGS. 1a–1e show a process for forming a recessed field oxide, in a first embodiment of the present invention.

The present invention provides, using two oxidation steps, a recessed field oxide for device isolation in a semiconductor substrate. In a process of the present invention, a second field oxide is grown in a second oxidation, after a first field oxide is grown and etched back to create a recessed position for growing the second field oxide.

FIGS. 1a–1e illustrate a process for forming recessed field oxide regions in a semiconductor wafer 100, in accordance with a first embodiment of the present invention. In this process, a pad oxide layer 111, approximately 100–200 Å thick, is formed on the surface of a semiconductor substrate 110 in semiconductor wafer 100. Pad oxide layer 111 can be formed, for example, in the presence of a mixture of hydrogen and oxygen at 800° C. A silicon nitride layer 112, is then deposited to a thickness of 1000–2000 Å over pad oxide 111 using, for example, a chemical vapor deposition (CVD) technique. Pad oxide 111 is provided as a stress-relieving layer for the oxidation-resistant silicon nitride layer 112, which is used in the next step as an oxidation mask.

The surface of semiconductor wafer 100 is then patterned by a photolithographical step, which selectively removes portions of nitride layer 112 and pad oxide 111 from semiconductor substrate 110. As shown in FIG. 1a, the etching step leaves nitride structures 112a and 112b and pad oxide structures 111a and 111b, defining and protecting the "active" regions in which devices are to be formed, and exposing the "field" regions, which serve to isolate active regions from each other.

Figure 1B:
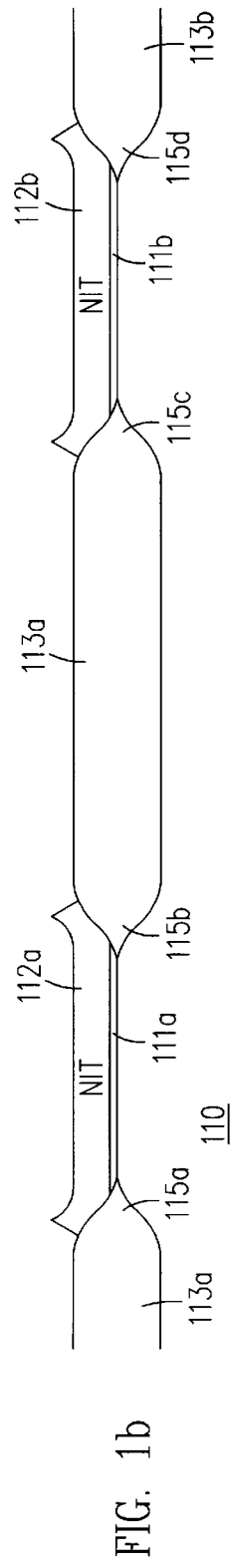
Figure 1C:
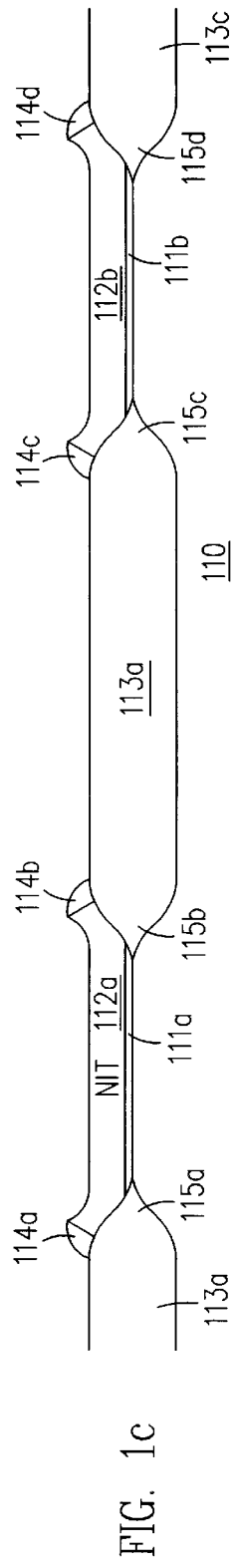

Using nitride structures 112a and 112b as oxidation masks, a first LOCOS field oxide layer 113, represented in FIG. 1b by field oxide regions 113a, 113b and 113c, is grown to a thickness of approximately 2000 Å at a suitable temperature (e.g. 950° C.), in the presence of hydrogen and oxygen. FIG. 1b shows some encroachment (i.e. bird's beak areas 115a, 115b, 115c and 115d) by field oxide layer 113 into the active regions protected by nitride regions 112a and 112b. A second silicon nitride layer 114 is then deposited to a thickness of approximately 1000 Å in substantially the same manner as silicon nitride layer 112 is deposited. An anisotropic etch of silicon nitride layer 114 forms nitride spacers 114a, 114b, 114c and 114d on the side walls of nitride structures 112a and 112b, as shown in FIG. 1c.

Nitride spacers 114a, 114b, 114c and 114d, in conjunction with nitride regions 112a and 112b, allow larger areas of field oxide regions 113a, 113b and 113c to be protected by a layer of silicon nitride.

Figure 1D:
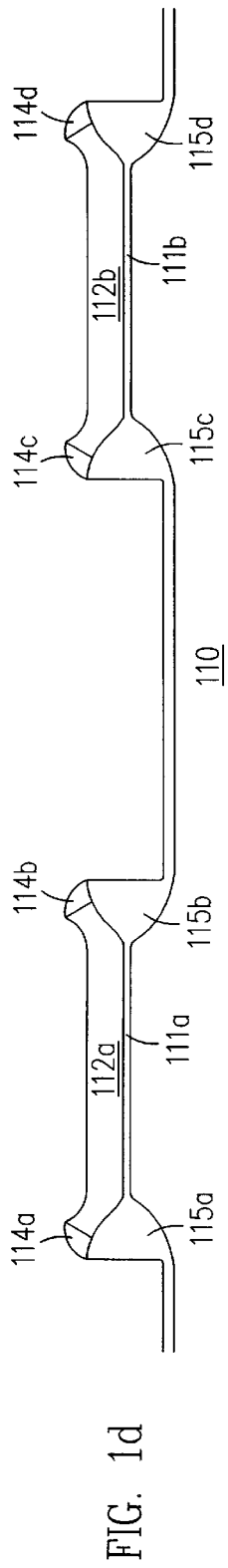

Using silicon nitride structures 112a and 112b, and nitride spacers 114a, 114b, 114c and 114d as etch masks, field oxide structures 113a, 113b and 113c are etched to achieve the cross section profile shown in FIG. 1d. Field oxide structures 113a, 113b and 113c can be etched using either a dry etch process (e.g. in a fluorine plasma) or a wet etch process (e.g. a dip in hydrofluoric acid). While field oxide structures 113a, 113b and 113c are removed substantially completely in the vertical direction, nitride spacers 114a, 114b, 114c and 114d limit the lateral etching of field oxide structures 113a, 113b and 113c, leaving behind bird's beak areas 115a, 115b, 115c and 115d.

Figure 1E:
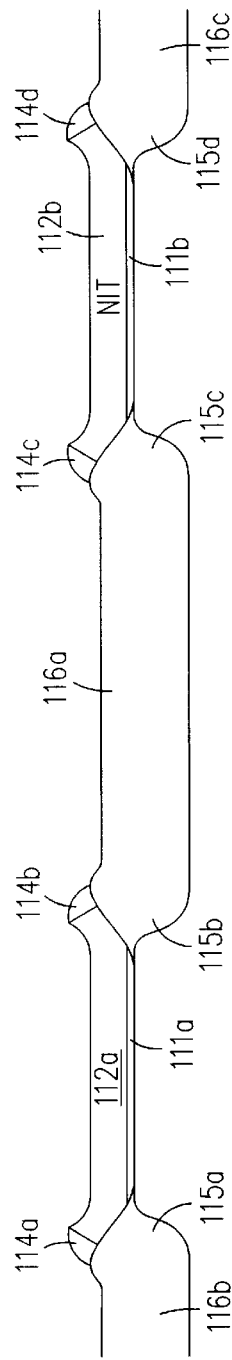

A second field oxide layer 116, represented in FIG. 1e by field oxide structures 116a, 116b and 116c, is then grown in substantially the same manner as first field oxide layer 113 to a thickness of 4000–6000 Å. Because second field oxide layer 116 is grown from a position where first oxide layer 113 is substantially removed, second field oxide layer 116 is grown from a recessed position, so that the resulting semiconductor surface can be controlled to be substantially planar, as shown in FIG. 1e. Further, bird's beak areas 115a, 115b, 115c and 115d, which are residues from first field oxide layer 113, limit the lateral growth of second field oxide 116, thus minimizing encroachment into the adjacent active regions by second field oxide layer 116. As a result, active regions of smaller dimensions can be achieved.

Nitride structures 112a and 112b and nitride spacers 114a, 114b, 114c and 114d can now be removed, using any suitable fabrication process, to allow device fabrication in the active regions.

Figure 2A:
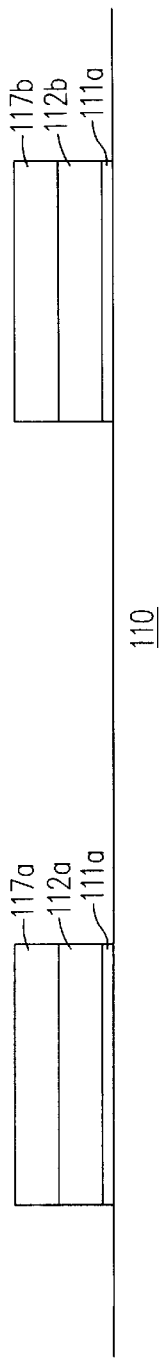
FIGS. 2a–2c show an alternative process for forming a recessed field oxide, in a second embodiment of the present invention.
Figure 2B:
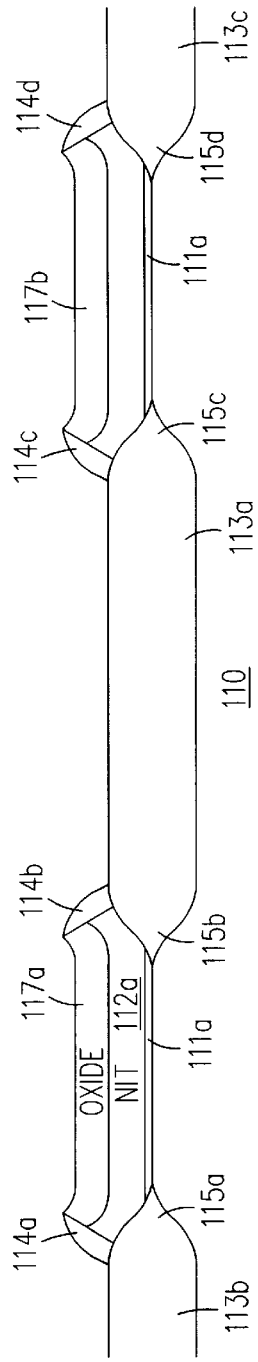
Figure 2C:
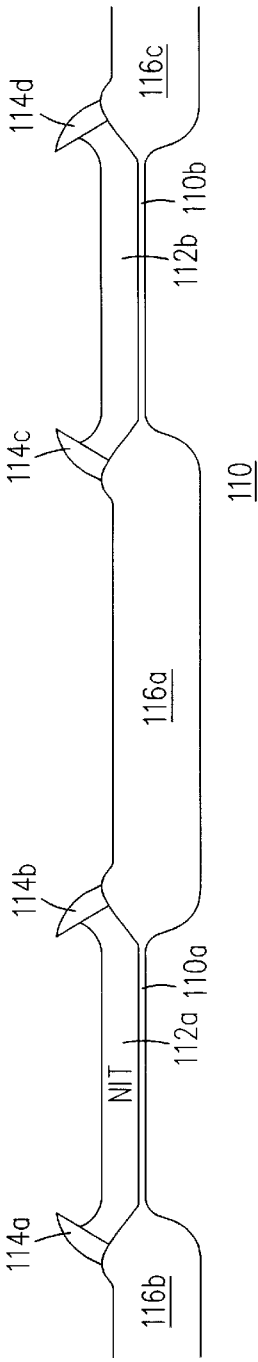

FIGS. 2a–2c show another process for providing recessed isolation, in accordance with a second embodiment of the present invention. To facilitate comparison between the process described above, illustrated by FIGS. 1a–1e and this process, illustrated by FIGS. 2a–2c, like structures in FIGS. 1a–1e and FIGS. 2a–2c are provided like reference numerals. According to this second embodiment of the present invention, pad oxide layer 111 and nitride layer 112 are provided over the surface of semiconductor wafer 100 in the manner described above with respect to FIGS. 1a–1e. Unlike the process of the first embodiment discussed above, however, the process of this second embodiment deposits an oxide layer 117 on top of nitride layer 112, using a suitable deposition technique. The surface of oxide layer 117 is then photolithographically patterned to define the field and active regions. The portions of oxide layer 117, nitride layer 112 and pad oxide layer 111 exposed by the photoresist are then etched away, leaving behind deposited oxide structures 117a and 117b, nitride structures 112a and 112b, and pad oxide structures 111a and 111b, as shown in FIG. 2a.

Thereafter, the first field oxide layer 113 (represented in FIG. 2b by field oxide regions 113a, 113b and 113c) is grown, and nitride spacers 114a, 114b, 114c and 114d are formed in substantially the same manner as discussed above with respect to FIGS 1b and 1c. The resulting cross section profile of semiconductor wafer 100 is shown in FIG. 2b. Subsequently, first field oxide layer 113 is removed along with oxide structures 117a and 117b. During this oxide removal step, nitride structures 112a and 112b and spacers 114a, 114b, 114c and 114d act as etch masks. The second field oxide layer 116 is then grown in substantially the same manner as discussed above, with respect to FIGS. 1d and 1e. The resulting cross section profile of semiconductor wafer 100 is shown in FIG. 2c. Nitride structures 112a and 112b, and nitride spacers 114a, 114b, 114c and 114d can then be removed using any suitable method.

The process of FIGS. 2a–2c uses deposited oxide layer 117 to protect nitride structure 112a and 112b during both the formation of nitride spacers 114a, 114b, 114c and 114d and the removal of first field oxide layer 113. With oxide layer 117 protecting nitride structures 112a and 112b, nitride layer 112 can be made thinner, thereby decreasing the stress on the surface of semiconductor wafer 100.

The above detailed description is provided to illustrate the specific embodiments of the present invention and is not to be taken as limiting. Numerous variations and modifications within the scope of the present invention are possible. The present invention is defined by the following claims.

I claim:

1. A method for forming recessed isolation in a semiconductor substrate, comprising the steps of:

forming a nitride layer over said surface of said semiconductor substrate;

selectively removing said nitride layer to expose a selected area on the surface of said semiconductor substrate;

oxidizing said selected area to form a first field oxide region;

forming nitride spacers abutting the side walls of said nitride layer, so as to form an extended nitride region over said first field oxide region;

substantially removing said first field oxide region using an anisotropic etching technique, so as to form a recessed region in said semiconductor substrate; and oxidizing said recessed region to form a second field oxide region.

2. A method for forming recessed isolation in a semiconductor substrate, comprising the steps of:

forming a nitride layer over said surface of said semiconductor substrate;

selectively removing said nitride layer to expose a selected area on the surface of said semiconductor substrate;

oxidizing said selected area to form a first field oxide region;

forming nitride spacers abutting the side walls of said nitride layer, so as to form an extended nitride region over said first field oxide region;

substantially removing said first field oxide region, using an anisotropic technique and using said extended nitride region as a mask, so as to form a recessed region in said semiconductor substrate; and oxidizing said recessed region to form a second field oxide region.

3. A method as in claim 1, further comprising the step of providing a deposited oxide layer on top of said nitride layer, and wherein said step of selectively removing said nitride layer selectively removes also corresponding portions of said deposited oxide layer.

4. A method as in claim 1, further comprising the step of forming a layer of pad oxide prior to said step of forming a nitride layer.

5. A method as in claim 1, wherein said selected area represents an area of said semiconductor substrate in which an electronic device is to be formed.

6. A method for forming recessed isolation in a semiconductor substrate, comprising the steps of:

forming a nitride layer over said surface of said semiconductor substrate;

selectively removing said nitride layer to expose a selected area on the surface of said semiconductor substrate;

oxidizing said selected area to form a first field oxide region;

forming nitride spacers abutting the side walls of said nitride layer, so as to form an extended nitride region over said first field oxide region;

substantially removing said first field oxide region using an anisotropic etching technique, so as to form a recessed region in said semiconductor substrate; and oxidizing said recessed region to form a second field oxide region;

wherein said oxidizing steps are accomplished using local oxidation of silicon.

7. A method as in claim 1, wherein said step of forming nitride spacers comprises the steps of:

forming a second nitride layer over the surface of said semiconductor substrate; and selectively removing said second nitride layer to leave said nitride spacers.

8. A method as in claim 7, wherein said step of selectively removing said second nitride layer removes selected portions of said second nitride layer anisotropically.

* * * * *